United States Patent
Yang et al.

(10) Patent No.: US 7,331,811 B2
(45) Date of Patent: Feb. 19, 2008

(54) CHIP RECORDER

(75) Inventors: Chun-Wei Yang, Taoyuan (TW); Shih-Hua Lei, Taoyuan (TW)

(73) Assignee: High Tech Computer, Corp., Taoyuan (TW)

( * ) Notice: Subject to any disclaimer, the term of this patent is extended or adjusted under 35 U.S.C. 154(b) by 0 days.

(21) Appl. No.: 11/491,061

(22) Filed: Jul. 24, 2006

(65) Prior Publication Data
US 2007/0020983 A1    Jan. 25, 2007

(30) Foreign Application Priority Data
Jul. 25, 2005    (TW) ............................... 94125129 A

(51) Int. Cl.
*H01R 13/62* (2006.01)
(52) U.S. Cl. ...................................... 439/331
(58) Field of Classification Search ................ 439/331, 439/33, 66
See application file for complete search history.

(56) References Cited

U.S. PATENT DOCUMENTS

| | | | | |
|---|---|---|---|---|
| 6,162,066 | A * | 12/2000 | Glick et al. | 439/73 |
| 6,368,137 | B1 * | 4/2002 | Orwoll | 439/331 |
| 6,739,894 | B2 * | 5/2004 | Ogura | 439/330 |
| 6,966,783 | B2 * | 11/2005 | Hachuda et al. | 439/66 |
| 7,108,535 | B1 * | 9/2006 | Mingviriya | 439/331 |
| 2004/0029412 | A1 * | 2/2004 | Hachuda et al. | 439/66 |

* cited by examiner

*Primary Examiner*—Tulsidas C. Patel
*Assistant Examiner*—Phuongchi Nguyen
(74) *Attorney, Agent, or Firm*—Birch, Stewart, Kolasch & Birch, LLP

(57) ABSTRACT

A chip recorder is disposed on a circuit board for writing a chip, wherein the chip comprises a contact and the circuit board comprises a contact. The chip recorder comprises a chip housing, a base, a bracket, a push finger and an elastic member. The chip housing is detachably secured on the circuit board for accommodating the chip. The base is detachably mounted to the chip housing and disposed between the chip housing and the circuit board wherein the base comprises at least one probe and a first end of the probe is electrically connected to the contact of the circuit board. The bracket is moveably connected to the chip housing and the push finger is pivotally connected to the bracket and moveably connected to the chip housing. The elastic member is disposed between the bracket and the chip housing to provide a resilient force against the bracket and the chip housing, wherein the resilient force allows the bracket and the push finger to move relative to the chip housing, and allows the push finger to abut against the chip to electrically connect a second end of the probe and the contact of the chip, and when the bracket is pressed toward the chip hosing, the push finger is moved to release the chip from the chip housing.

13 Claims, 10 Drawing Sheets

CHIP RECORDER

BACKGROUND OF THE INVENTION

1. Field of the Invention

The invention relates to a chip recorder, and in particular relates to a chip recorder of which the components are easily replaced.

2. Description of the Related Art

FIG. 1A shows a conventional chip recorder 1 with a chip C installed therein. Tin balls (not shown) on the chip C contact the clamps 14 in the chip recorder 1. During chip writing, the chip recorder 1 is mounted on a testing circuit board T, and the clamps 14 electrically connect the chip C and allow the testing circuit board T to write the chip C.

FIG. 1B is an enlarged view of portion A of FIG. 1A, which is a top view of the clamps 14. FIG. 1C is a side view of the clamps 14, in which the clamps 14 are V-shaped. FIGS. 1D and 1E show the clamps 14 clamping the tin balls C1 of the chip C. The clamps 14 are in a V-shaped configuration to clamp the tin balls of the chip for an electrical connection so that the clamps 14 are liable to be damaged and have a shorter life time. Additionally, the ends of the clamps 14 are welded in the through holes 11 of the testing circuit board T. Therefore, it is hard to disassemble the clamps 14 for repair when damaged. Thus, when a single clamp 14 is damaged, the whole chip recorder 1 and the test board T must be replaced, and manufacture cost is increased.

BRIEF SUMMARY OF THE INVENTION

The invention relates to a chip recorder disposed on a circuit board for writing a chip. The chip comprises a contact and the circuit board comprises a contact. The chip recorder comprises a chip housing, a base, a bracket, a push finger and an elastic member. The chip housing is detachably secured on the circuit board for accommodating the chip. The base is detachably mounted to the chip housing and disposed between the chip housing and the circuit board wherein the base comprises at least one probe and a first end of the probe is electrically connected to the contact of the circuit board. The bracket is moveably connected to the chip housing and the push finger is pivotally connected to the bracket and moveably connected to the chip housing. The elastic member is disposed between the bracket and the chip housing to provide a resilient force against the bracket and the chip housing, wherein the resilient force allows the bracket and the push finger to move relative to the chip housing, and allows the push finger to abut against the chip to electrically connect a second end of the probe and the contact of the chip, and when the bracket is pressed toward the chip hosing, the push finger is moved to release the chip from the chip housing.

In the embodiments of the invention, the first base and the second base can be selected to be mounted to the chip housing. The chip housing is detachably secured to the circuit board via a screw, and the upper portion and the lower portion of the base are mounted via a screw. Thus, by the invention, bases of different sizes can be selected to incorporate with the testing circuit boards for writing selected sizes of chips. Additionally, in the invention, the probe can be easily detached and replaced from the base.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the subsequent detailed description and the accompanying drawings, which are given by way of illustration only, and thus are not limitative of the present invention, and wherein.

DETAILED DESCRIPTION OF THE INVENTION

Figure 1A:
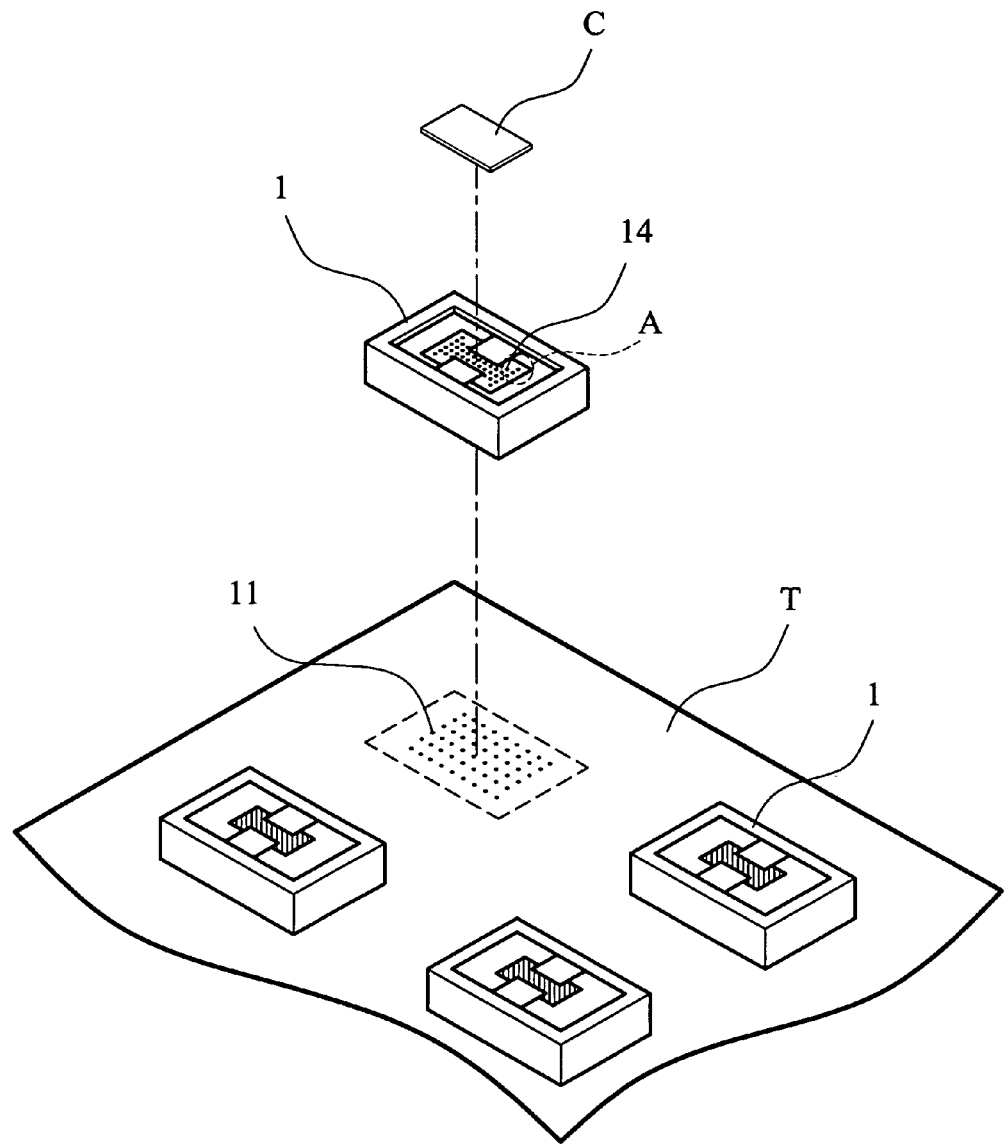
FIG. 1A shows a conventional recorder.
Figure 1B:
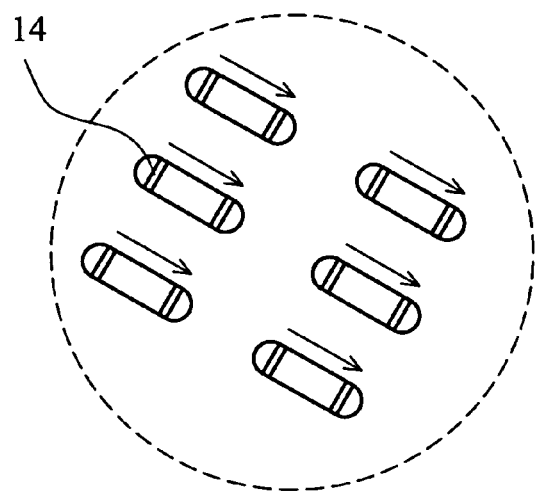
FIG. 1B is an enlarged view of portion A in FIG. 1A.
Figure 1C:
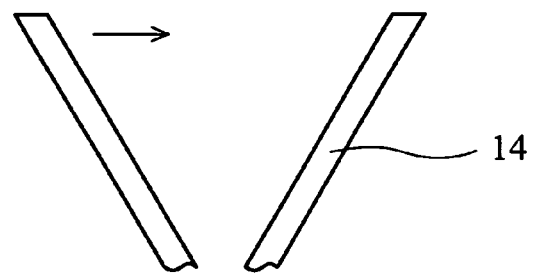
FIG. 1C is a side view of conventional clamps.
Figure 1D:
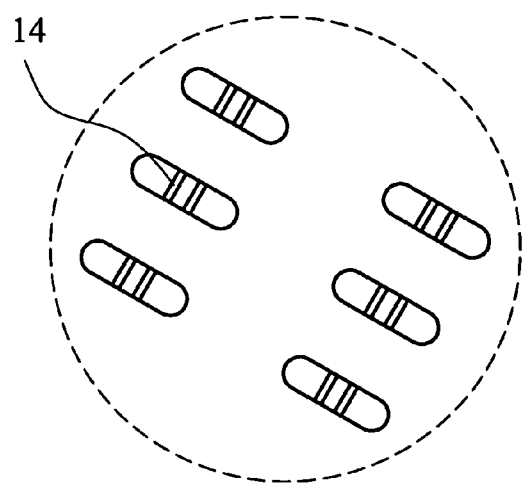
FIGS. 1D and 1E show the conventional clamps clamping tin balls of a chip.
Figure 1E:
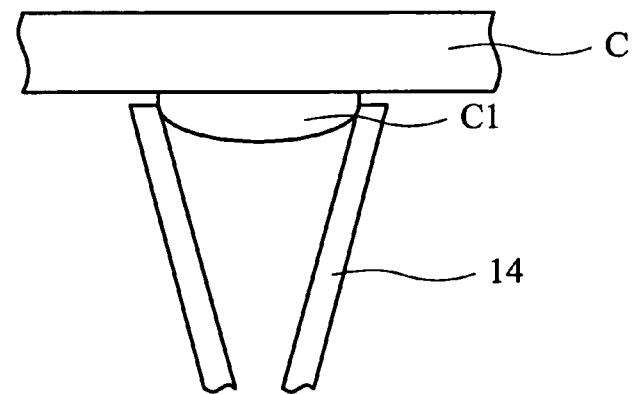
Figure 2A:
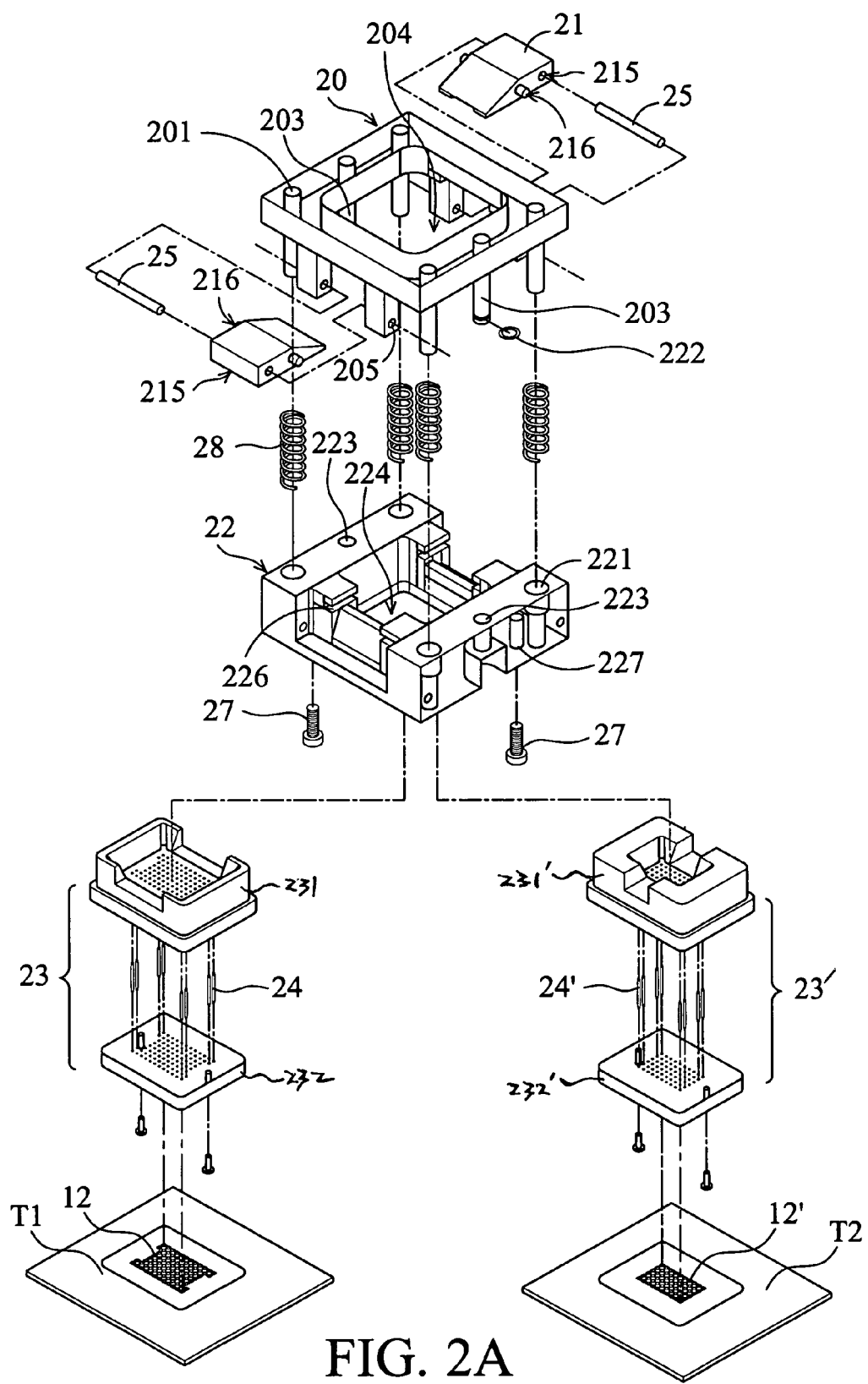
FIG. 2A is an exploded view of a chip recorder of the invention.

FIG. 2A depicts an exploded view of a chip recorder 2 of the invention. The chip recorder 2 comprises a bracket 20, two push fingers 21, a chip housing 22, and a first base 23. For different sizes of chips, the first base 23 can be replaced by a second base 23' in use. The assembled chip recorder 2 is mounted on a testing circuit board T1 or a testing circuit board T2. When a chip C is placed into the chip recorder 2, testing circuit board T1 or the testing circuit board T2 writes or tests the chip C. Generally, four chip recorders 2 may be mounted on the testing circuit board T1 or on the testing circuit board T2, at the same time, for chip writing. The first base 23 comprises an upper portion 231 and a lower portion 232. The second base 23' also comprises an upper 231' and a lower portion 232'.

The first base 23 and the second base 23' can be selected to mount to the chip housing 22 for different sizes of chips. When a first chip (for example, a chip with a diameter of 14 mm×14 mm) is to be written, the first base 23 is mounted to the chip housing 22, and the first chip is electrically connected to the first base 23 for chip writing. When the second chip (for example, a chip with a diameter of 10 mm×12 mm) is to be written, the second base 23' is fitted into to the chip housing 22, and the second chip is then electrically connected to the second base 23' for chip writing.

The first base 23 comprises a plurality of probes 24, and the second base 23' comprises a plurality of probes 24'. In FIG. 2A, the probes 24 and the probes 24' are simplified in quantity to make the description concise. The probes 24 are embedded in the first base 23, and are held between the upper portion 231 and the lower portion 232 of the first base 23. Similarly, the probes 24' are embedded in the second base 23', which are held between the upper portion 231' and the lower portion 232' of the second base 23'.

The testing circuit board T1 comprises a plurality of contacts 12, and the testing circuit board T2 also comprises a plurality of contacts 12'.

The bracket 20 is slidably connected to the chip housing 22. The first base 23 and the second base 23' are selectable fitted to the chip housing 22. Thus, in the present invention, one of different sizes of bases including the first base 23 and the second base 23' is chosen to incorporate with the testing circuit board T1 or with the testing circuit board T2 for writing or testing different sizes of chips.

The bracket 20 is generally in a rectangular shape, and comprises four guide pins 201, two position posts 203 and four pivot holes 205. The guide pins 201 are respectively disposed at four corners of the bracket 20. The position posts 203 are opposingly disposed on the two sides of the bracket 20.

Each of the push fingers 21 is generally in a rectangular shape with a wedge-shaped profile, and has a lateral through hole 215 and a pair of lateral protrusions 216. The push fingers 21 are pivotally connected to the bracket 20 symmetrically. More specifically, each of two pivots 25 respectively passes through one of the through holes 215 of the push fingers 21 and extends into the pivot holes 205 of the bracket 20 to allow the push fingers 21 to pivotally connect to the bracket 20.

The chip housing 22 is generally in a rectangular shape and has four guide holes 221, two C-rings 222, two position holes 223, four grooves 226 and two threaded holes 227. The guide holes 221 are respectively disposed at four corners of the chip housing 22, corresponding to four guide pins 201 of the bracket 20. Four guide pin springs 28 respectively telescope onto four guide pins 201 and disposed in four guide holes 221 so that the guide pins 201 are movable back and forth in the guide holes 221, that is, the bracket 20 is moveable relative to the chip housing 22 and the guide pin springs 28 provide resilient force to abut against the bracket 20.

Two position holes 223 are opposingly disposed on two sides of the chip housing 22, corresponding to the position posts 203 of the bracket 20. Each of the position posts 203 respectively passes through one of two position holes 223 and the front end of each of the position posts 203 is mounted by the C-ring 222, to prevent the position posts 203 from escaping from the position holes 223.

Each pair of the grooves 226 of the chip housing 22 corresponds to one of the push fingers 21. The protrusions 216 of each push finger 21 are movably disposed in two opposite grooves 226 to connect the push fingers 21 and the chip housing 22.

The first base 23 and the second base 23' are in substantially rectangular shapes and are selectably fitted into an opening 224 of the chip housing 22. The opening 224 of the chip housing 22 can expose the bases and the probes embedded therein. The chip C passes through a passage 204 of the bracket 20 and is then guided by the opening 224 of the chip housing 22, and precisely placed onto the base 23 or 23'.

After the bracket 20, the push fingers 21 and the chip housing 22 are assembled, two threaded posts 27 pass through the testing circuit board T1 or testing circuit board T2 and then fasten into two threaded holes 227 of the chip housing so that the chip recorder 2 is detachably secured to the testing circuit board T1 or testing circuit board T2.

Figure 2B:
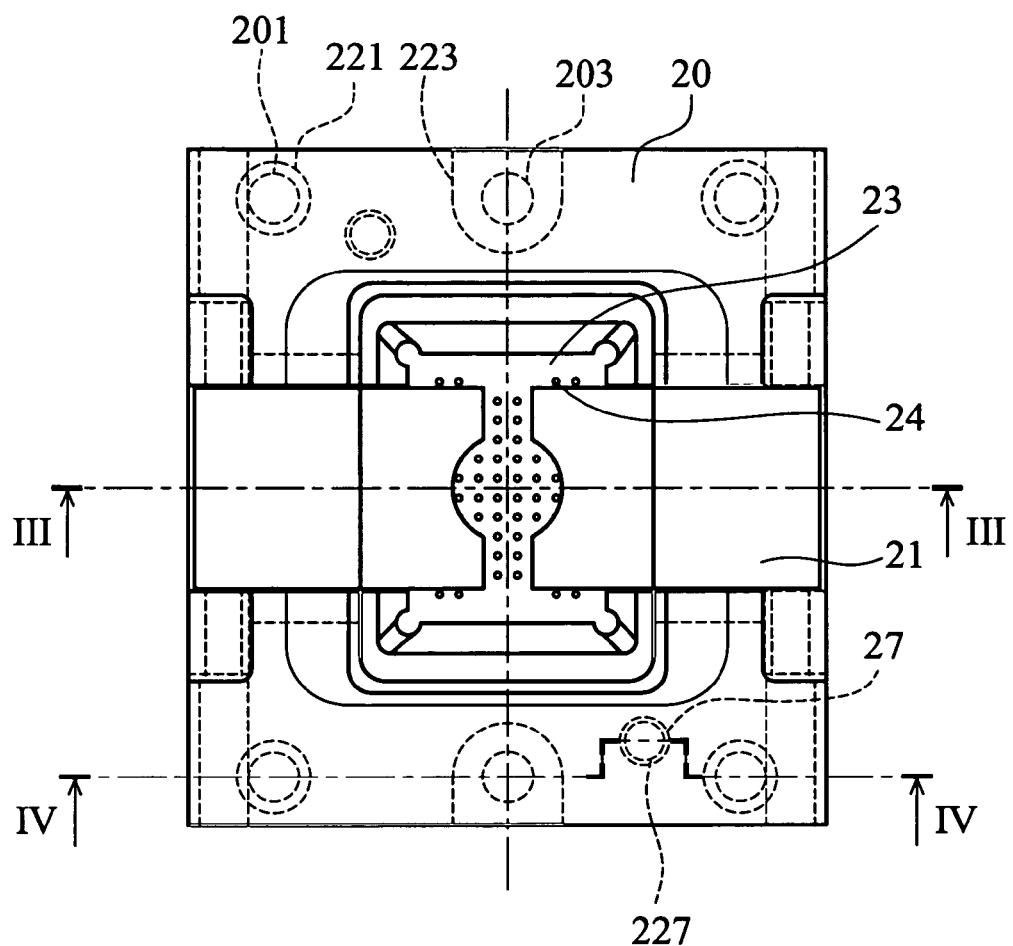
FIG. 2B is a top view of a chip recorder of the invention.
Figure 3A:
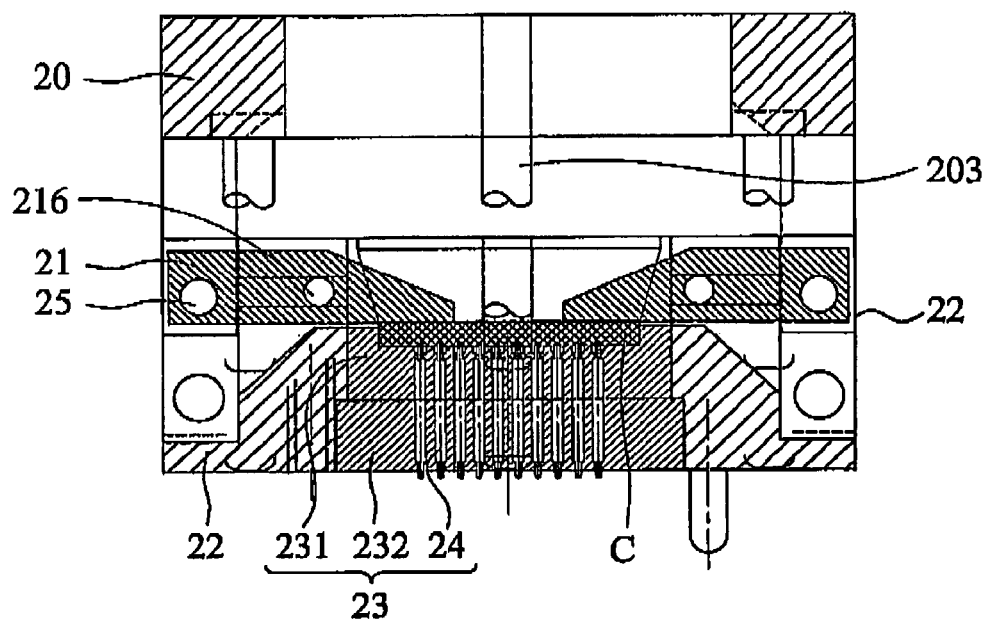
FIGS. 3A and 3B are sectional views along line III-III in FIG. 2B.
Figure 3B:
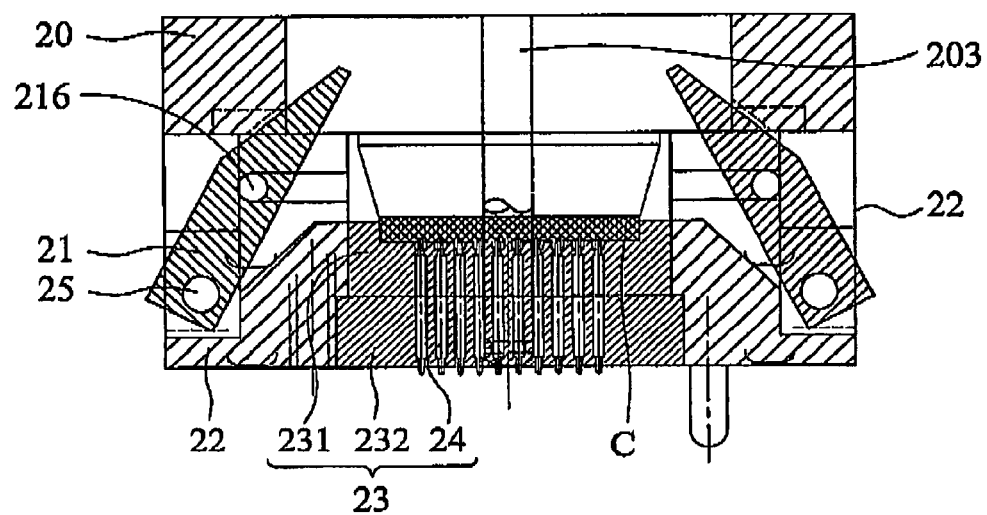

With reference to FIGS. 2B, 3A and 3B, FIG. 2B is a top view of the assembled chip recorder 2, and FIGS. 3A and 3B are sectional views along line III-III in FIG. 2B. Push fingers 21 are pivotally connected to the bracket 20 by the pivots 25 and slidably connected to the chip housing 22 by the protrusions 216. When the bracket 20 is moved toward the chip housing 22 (moved downward as illustrated in FIG. 3B), the bracket 20 pushes the back ends of push fingers 22 moving downward. The portions of the push fingers 21 connected to the pivots 25 are moved toward the chip housing 22, and the protrusions 216 of the push fingers 21 are moved outward in the grooves 226. Namely, the front ends of the push fingers 21 can be moved in the passage 204 of the bracket 20 and in the opening 224 of the chip hosing 22 via the connection of the pivots 25 and tee protrusions 216 with the bracket 20 and the chip hosing 22, so that the push fingers 21 can be rotated to the position as shown in FIG. 3B. The chip C is then able to pass through the passage 204 and the opening 224, and is placed onto the base 23. After the chip C is placed onto the base 23, the bracket is released and moves away from the chip housing 22 (moved upward as illustrated in FIG. 3A), so that the front ends of the push fingers 21 return to the original position as shown in FIG. 3A to abut against the chip C.

Figure 4A:
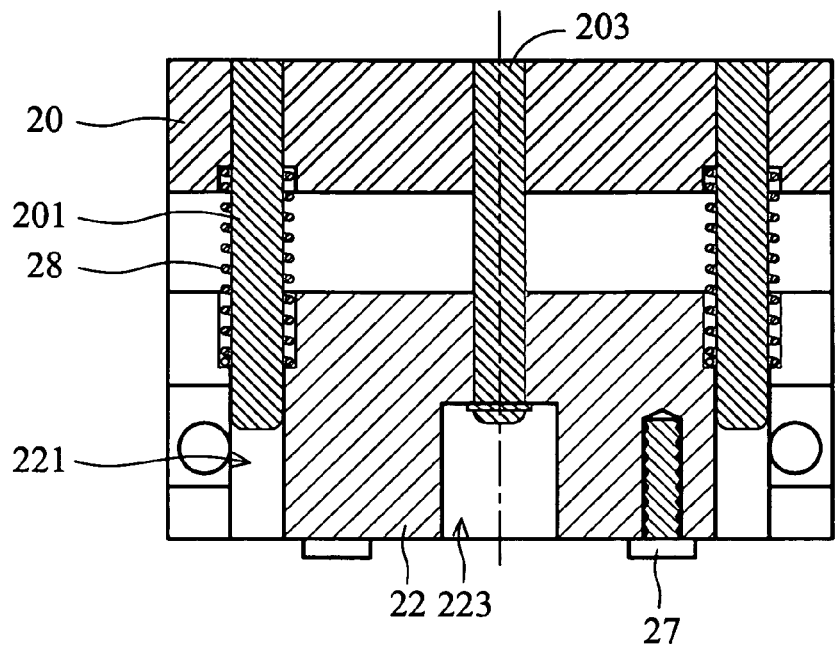
FIGS. 4A and 4B are sectional views along line IV-IV in FIG. 2B.
Figure 4B:
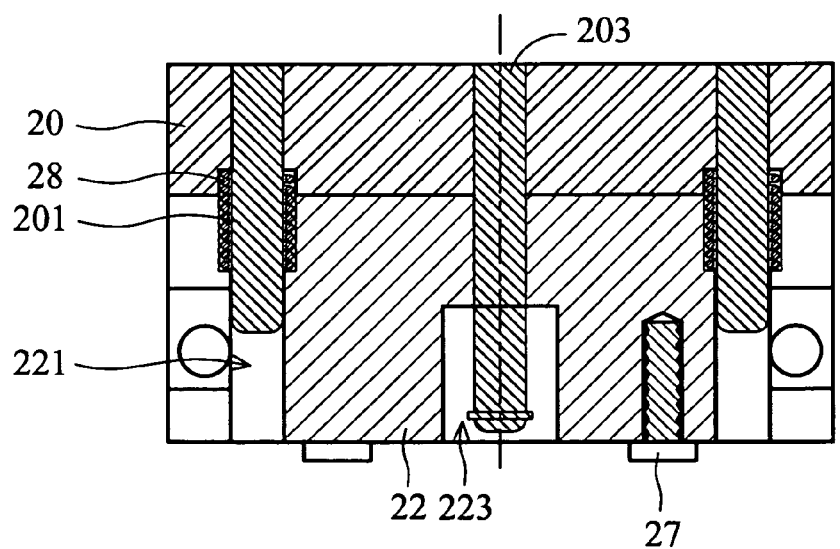

FIGS. 4A and 4B depicts a sectional view along line IV-IV in FIG. 2B. Referring to FIGS. 4A and 4B, the guide pin springs 28 telescope onto the guide pins 201 and are then disposed into the guide holes 221. The resilient force provided by the guide pin springs 28 abuts against the bracket 20 and forces the bracket 20 away from the chip housing 22. Moreover, the position posts 203 are disposed in the position holes 233 to connect the bracket 20 and the chip housing 22.

Figure 5A:
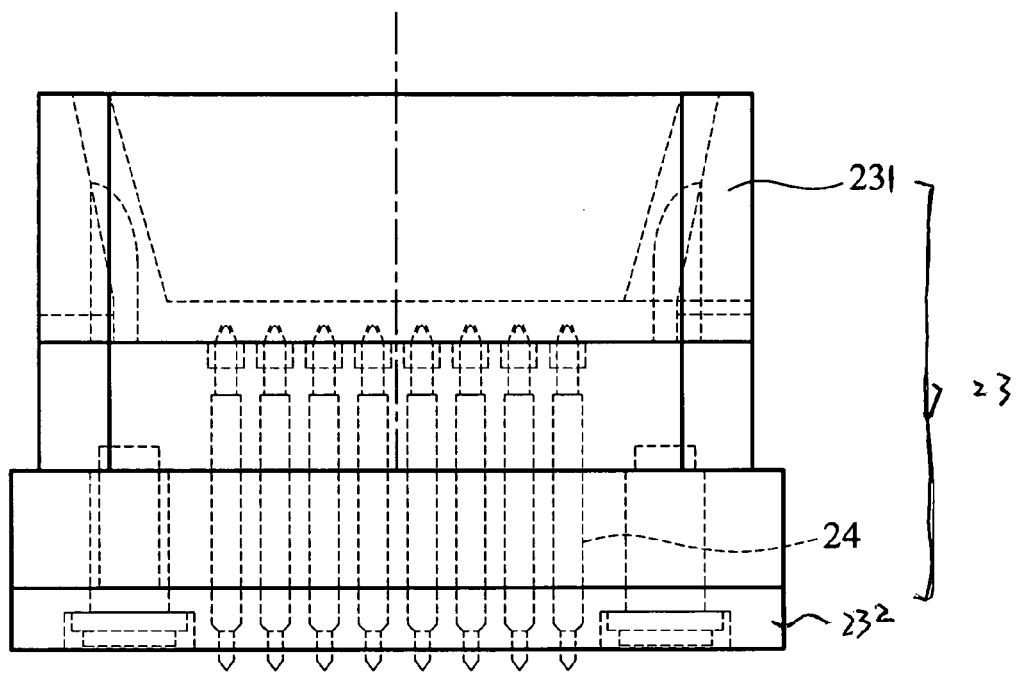
FIG. 5A is a sectional view of the first base of the invention.

FIG. 5A is a sectional view of the first base 23, which comprises a plurality of probes 24 disposed in a matrix manner corresponding to the tin balls on the first chip (not shown). The probes 24 are embedded in the first base 23, which are held by the upper portion 231 and the lower portion 232 of the base 23. Thus, the probes 24 can be easily detached and replaced from the base 23. The upper portion 231 and the lower portion 232 are mounted via screws. The first end 24A and the second end 24B of each of the probes 24 respectively extend out of the upper portion 231 and the lower portion 232 of the base 23. The structure of the second base 23' is similar to the first base 23.

Figure 5B:
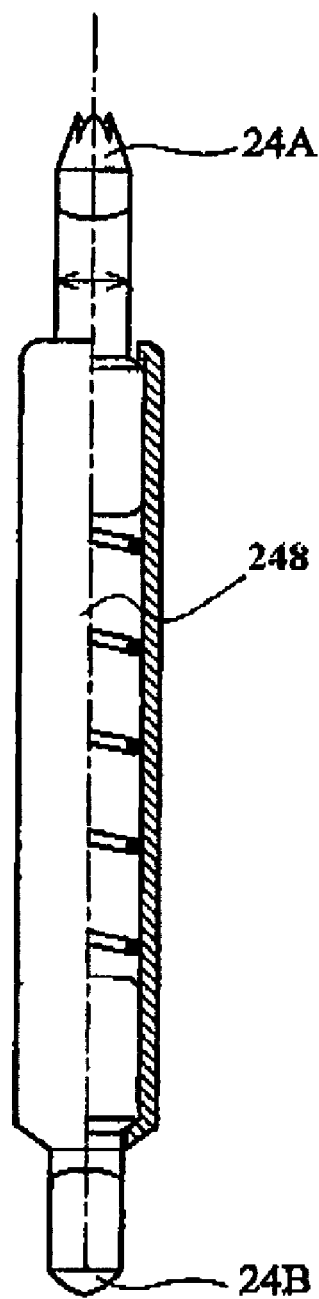
FIG. 5B shows a probe of the invention.
Figure 5C:
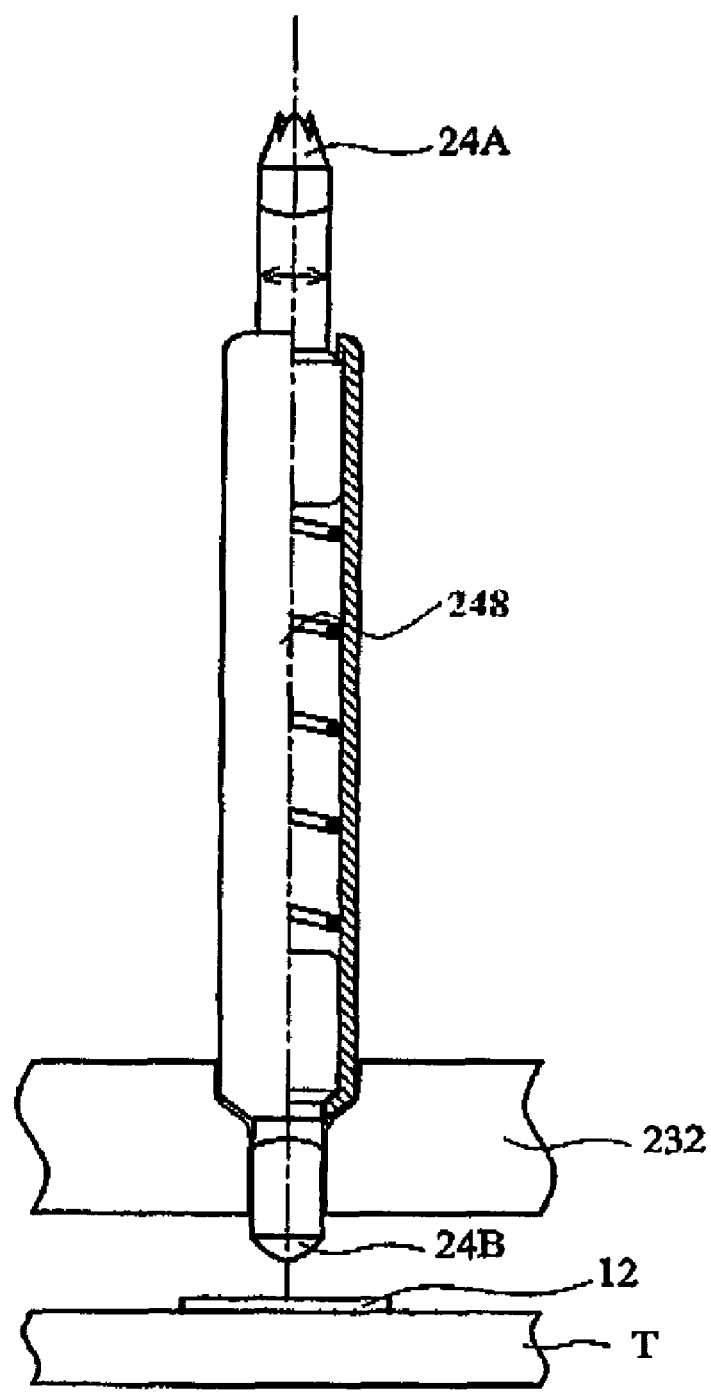
FIG. 5C shows the probe abutting a testing circuit board of the invention.

FIG. 5B depicts the profile of one probe 24 used in the chip recorder 2 of the invention. Each of the probes 24 has a first end 24A and a second end 24B. The first end 24A has a shape of crown to contact the tin ball on the chip C. The first end 24A and the second end 24B are coated with gold. After the probes 24 are assembled into the base 23, the second ends 24B of the probes 24 extend out of the lower portion 232. With reference to FIG. 5C, the second end 24B abuts against the contact pad 12 of the testing circuit board T1 for connecting the chip C and the testing circuit board T1. Furthermore, each of the probes 24 has a spring 248 disposed therein to provide a resilient force abutting against the first end 24A and the second end 24B of each of the probes 24 so that the first end 24A can tightly contact the tin balls of the chip. Compared with conventional art, in the present invention, the second end 24B of probe 24 can abut against the contact pad 12 to transmit electricity without using solder to secure the probe 24 and the contact pad 12. In replacing the probes 24, it is not necessary to separate the probes 24 from melting solder. Thus, in the present invention, the probes 24 can be easily detached and replaced when damaged In the embodiments of the invention, the first base and the second base can be selectively mounted to the chip housing for use. The chip housing is secured on the circuit board via screws, and the upper portion and the lower portion of the base are also mounted via screws. Thus, the invention can choose one of different sizes of bases to incorporate with the testing circuit boards for testing or writing different sizes of chips. Additionally, in the present invention, the probe can be easily detached and replaced from the base when damaged.

While the invention has been described by way of example and in terms of the preferred embodiment, it is to be understood that the invention is not limited thereto. To the contrary, it is intended to cover various modifications and similar arrangements (as would be apparent to those skilled in the art). Therefore, the scope of the claims should be accorded the broadest interpretation so as to encompass all such modifications and similar arrangements.

What is claimed is:

1. A chip recorder disposed on a circuit board for writing data into a chip, wherein the chip comprises a contact and the circuit board comprises a contact, the chip recorder comprising:
   a chip housing detachably secured on the circuit board for accommodating the chip;
   a base detachably mounted to the chip housing and disposed between the chip housing and the circuit board, wherein the base comprises at least one probe, and a first end of the probe is electrically connected to the contact of the circuit board;
   a bracket moveably connected to the chip housing;
   a push finger pivotally connected to the bracket and moveably connected to the chip housing; and
   an elastic member disposed between the bracket and the chip housing and providing a resilient force against the bracket and the chip housing, wherein the resilient force allows the bracket and the push finger to move relative to the chip housing and allows the push finger to abut against the chip to electrically connect a second end of the probe and the contact of the chip, and when the bracket is pressed toward the chip hosing, the push finger is moved to release the chip from the chip housing,
   wherein the push finger pivotally connects to the bracket by a pivot, the push finger comprises a protrusion slidably disposed in a groove of the chip housing, and the pivot is separated from the protrusion.

2. The chip recorder of claim 1, wherein the chip housing is secured to the circuit board via a screw.

3. The chip recorder of claim 1, wherein the elastic member comprises a spring to provide the resilient force.

4. The chip recorder of claim 3, wherein the bracket comprises a guide pin movably extending trough a guide hole of the chip housing, and the spring is disposed in the guide hole and telescopes on the guide pin.

5. The chip recorder of claim 1, wherein the chip housing has an opening to expose the probe, and the chip is placed into the opening to be abutted by the push finger and electrically connected to the probe.

6. The chip recorder of claim 5, wherein the bracket has a passage connected to the opening to allow the chip being placed into the opening trough the passage and the push finger is moveably extended in the passage and the opening.

7. The chip recorder of claim 1, wherein the chip housing fits the base.

8. The chip recorder of claim 7, wherein the bracket comprises a position post slidably disposed in a position hole of the chip housing.

9. The chip recorder of claim 8, further comprising a C-ring mounted to a front end of the position post.

10. The chip recorder of claim 1, wherein the base comprises an upper portion and a lower portion detachably mounted to the upper portion, and the probe is held between the upper portion and the lower portion, and the second end and the first end of the probe extend out of the upper portion and the lower portion, respectively.

11. The chip recorder of claim 10, wherein the upper portion and the lower portion of the base are mounted via a screw.

12. The chip recorder of claim 10, wherein the probe further comprises a spring providing a resilient force against the first end and the second end.

13. The chip recorder of claim 10, wherein the second end of the probe has a shape of crown.

* * * * *